United States Patent
Yang (10) Patent No.: US 8,284,873 B2
(45) Date of Patent: Oct. 9, 2012

(54) WIRELESS COMMUNICATION RECEIVER HAVING DE-INTERLEVER AND RELATED SIGNAL PROCESSING METHOD THEREOF

(75) Inventor: Shun-An Yang, Hsinchu County (TW)

(73) Assignee: Mediatek Inc., Science-Based Industrial Park, Hsin-Chu (TW)

( * ) Notice: Subject to any disclaimer, the term of this patent is extended or adjusted under 35 U.S.C. 154(b) by 759 days.

(21) Appl. No.: 12/419,312

(22) Filed: Apr. 7, 2009

(65) Prior Publication Data

US 2010/0254493 A1    Oct. 7, 2010

(51) Int. Cl.
*H03D 1/00* (2006.01)
(52) U.S. Cl. ......... 375/340; 375/262; 375/265; 714/701
(58) Field of Classification Search .................. 375/260, 375/340, 262, 265; 714/701
See application file for complete search history.

(56) References Cited

U.S. PATENT DOCUMENTS

| 5,483,541 | A | * | 1/1996 | Linsky | 714/701 |
| 5,719,875 | A | | 2/1998 | Wei | |
| 5,771,081 | A | | 6/1998 | Lee | |
| 2006/0013342 | A1 | * | 1/2006 | Rhee et al. | 375/340 |
| 2008/0276138 | A1 | * | 11/2008 | Flynn et al. | 714/701 |
| 2009/0075614 | A1 | * | 3/2009 | Lin et al. | 455/240.1 |
| 2009/0135929 | A1 | * | 5/2009 | Yamasuge | 375/260 |

* cited by examiner

*Primary Examiner* — Eva Puente
(74) *Attorney, Agent, or Firm* — Winston Hsu; Scott Margo (57) ABSTRACT

A wireless communication receiver includes a first signal processing block, a second signal processing block, and a de-interleaver. The first signal processing block is configured for receiving a wireless communication signal and processing the wireless communication signal to generate a first output. The de-interleaver is coupled between the first signal processing block and the second signal processing block, and includes a plurality of branches implemented for de-interleaving the first output to generate a second output. The de-interleaver starts outputting the second output to the second signal processing block for further signal processing before all buffers included in the branches are full, and informs the second signal processing block of data derived from one or more unfull buffers included in the branches.

23 Claims, 4 Drawing Sheets

WIRELESS COMMUNICATION RECEIVER HAVING DE-INTERLEVER AND RELATED SIGNAL PROCESSING METHOD THEREOF

BACKGROUND

The disclosed embodiments relate to wireless communications, and more particularly, to a wireless communication receiver which can start outputting de-interleaver output before all buffers included in branches of the de-interleaver are full and notify a signal processing block following the de-interleaver about data that are derived from unfull buffer(s) included in the branches of the de-interleaver, and a related signal processing method thereof.

Figure 1:
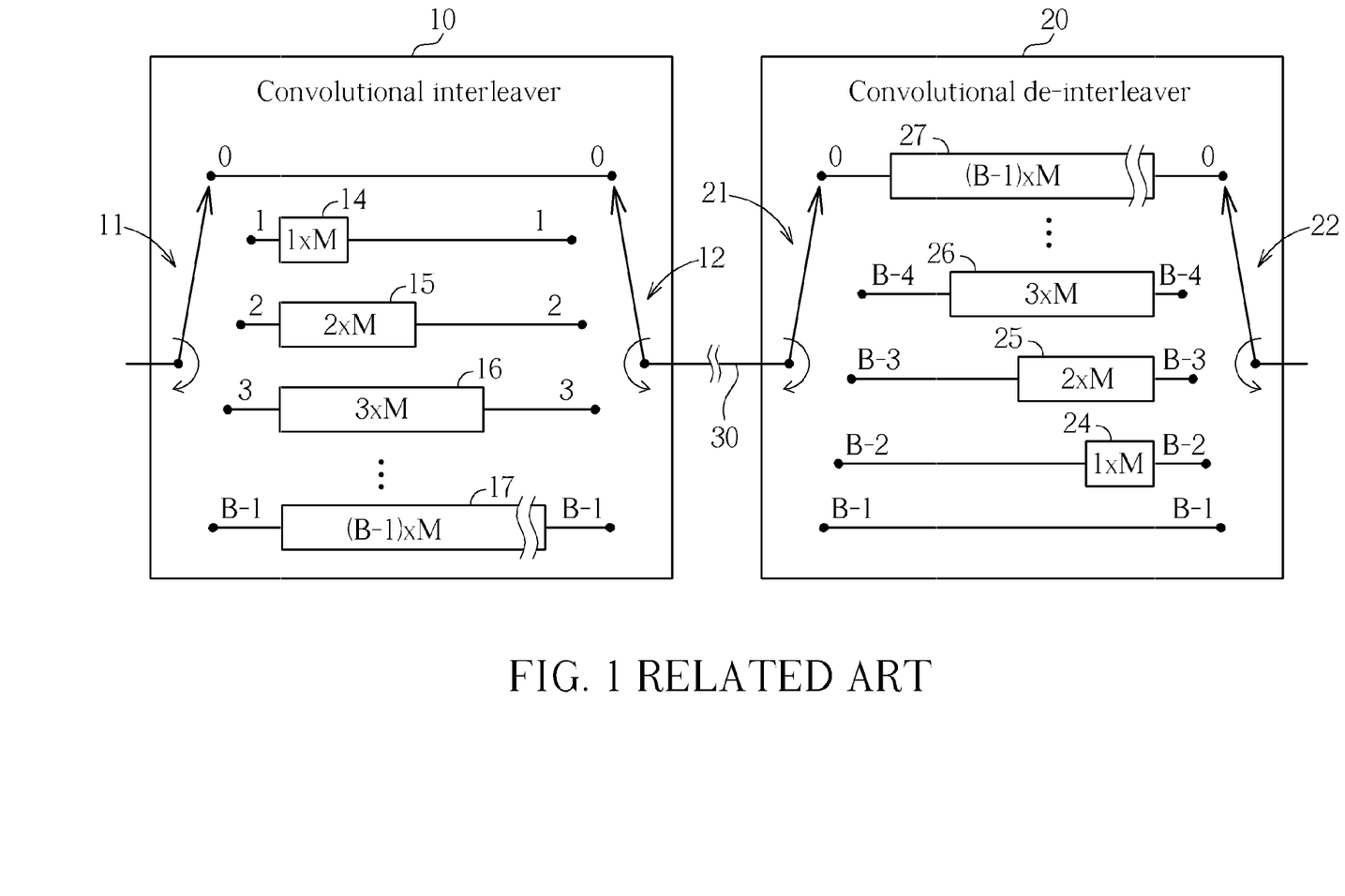
FIG. 1 is a diagram illustrating a conventional interleaver configuration and a conventional de-interleaver configuration.

Convolutional interleaving/de-interleaving is commonly used in a variety of communication systems. FIG. 1 is a diagram illustrating a conventional interleaver configuration and a conventional de-interleaver configuration. A convolutional interleaver 10 at a transmitting end of a communication channel 30 includes B branches indexed by 0, 1, 2, 3 ..., B−1, respectively. In addition, the branches in the convolutional interleaver 10 have different buffer lengths. For example, branch 0 is a direct connection with no buffer applied thereto, branches 1, 2, 3, and B−1 have buffers 14, 15, 16, and 17 disposed thereon for offering buffer lengths equal to 1×M, 2×M, 3×M, and (B−1)×M, respectively. A convolutional de-interleaver 20 at a receiving end of the communication channel 30 includes B branches indexed by 0 ..., B−4, B−3, B−2, and B−1, respectively. As one can see, the branches 0 ..., B−4, B−3, B−2, and B−1 in the convolutional de-interleaver 20 have the same buffer lengths as the branches B−1 ..., 3, 2, 1, and 0 in the convolutional interleaver 10. The convolutional interleaver 10 and convolutional de-interleaver 20 are operated by using the switches 11, 12, 21, and 22 to sequentially and cyclically select the branches. As details of the convolution interleaver 10 and convolutional de-interleaver 20 are well known to those skilled in the pertinent art, further description is omitted here for brevity.

In accordance with a conventional design, the convolutional de-interleaver 20 will not transmit data bits or symbols derived from the branches to a following signal processing stage (e.g., a decoder) until the convolutional de-interleaver 20 is full (i.e., all of the buffers included in the branches, such as buffers 24-27, are full), which results in a serious de-interleaving delay in certain communication systems. In other words, the following signal processing stage has to wait for its input data from the convolutional de-interleaver 20. For example, in a case where the buffer 27 with the longest buffer length is not full yet, but the remaining buffers with shorter buffer lengths are already full, the convolutional de-interleaver 20 directly discards any data bits or symbols derived from the branches as all of the branches in the convolutional de-interleaver 20 are not full yet; in another case where the buffer 27 with the longest buffer length becomes full, meaning that all of the branches in the de-interleaver 20 are full now, the convolutional de-interleaver 20 is allowed to start outputting data bits or symbols sequentially and cyclically derived from the branches to the following signal processing stage.

As one can see, the de-interleaving delay depends on the values of B and M. More specifically, the de-interleaving delay is equal to M*(B−1)*B. For certain communication systems, the acquisition time of the receiver would be quite long due to de-interleaving delay. Taking the Digital Terrestrial Multimedia Broadcasting (DTMB) receiver for example, if mode 1 (B=52 and M=240) is employed, the de-interleaving delay is approximately equal to 106.25 ms when the pseudo-random noise sequence in each signal frame has 945 symbols (i.e., PN=945), and if mode 2 (B=52 and M=720) is employed, the de-interleaving delay is approximately equal to 318.75 ms when PN=945. Therefore, it is desired to devise a novel scheme which can reduce the required time to pass the convolutional de-interleaver for improving the overall performance of the receiving end.

SUMMARY

In accordance with one exemplary embodiment of the present invention, an early de-interleaver output scheme implemented in a wireless communication receiver, such as a DTMB receiver, is proposed. According to an exemplary embodiment of the present invention, a wireless communication receiver is disclosed. The wireless communication receiver includes a first signal processing block, a second signal processing block, and a de-interleaver. The first signal processing block is configured for receiving a wireless communication signal and processing the wireless communication signal to generate a first output. The de-interleaver is coupled between the first signal processing block and the second signal processing block, and includes a plurality of branches implemented for de-interleaving the first output to generate a second output. The de-interleaver starts outputting the second output to the second signal processing block for further signal processing before all buffers included in the branches are full, and informs the second signal processing block of data derived from one or more unfull buffers included in the branches.

In accordance with another exemplary embodiment of the present invention, a signal processing method is disclosed. The signal processing method includes: receiving a wireless communication signal, and processing the wireless communication signal to generate a first output; de-interleaving the first output to generate a second output according to a plurality of branches; before all buffers included in the branches are full, starting outputting the second output to a following signal processing stage; informing the following signal processing stage of data that are derived from one or more unfull buffers included in the branches.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims to refer to particular system components. As one skilled in the art will appreciate, manufacturers may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . " The terms "couple" and "couples" are intended to mean either an indirect or a direct electrical connection. Thus, if a first device couples to a second device, that connection may be through a direct electrical connection, or through an indirect electrical connection via other devices and connections.

To put it simply, exemplary embodiments of the present invention propose making good use of the error checking and error correction capability of a decoder to achieve the objective of producing an early output. For instance, the decoder is a low-density parity check (LDPC) decoder which is capable of correcting error bits and judging whether a decoding result is error-free according to a parity check result. Therefore, before all of the buffers in a de-interleaver are full, it is possible that the data buffered in the de-interleaver have reached a sufficient data amount which allows the LDPC decoder to have an error-free decoding output. Based on such an observation, an early de-interleaver output scheme is proposed. For example, the early de-interleaver output scheme can be implemented in a wireless communication receiver, such as a DTMB receiver, to improve the channel scan speed and/or channel switch speed. For clear understanding of the technical features of the present invention, exemplary embodiments of the present invention are disclosed as follows.

Figure 2:
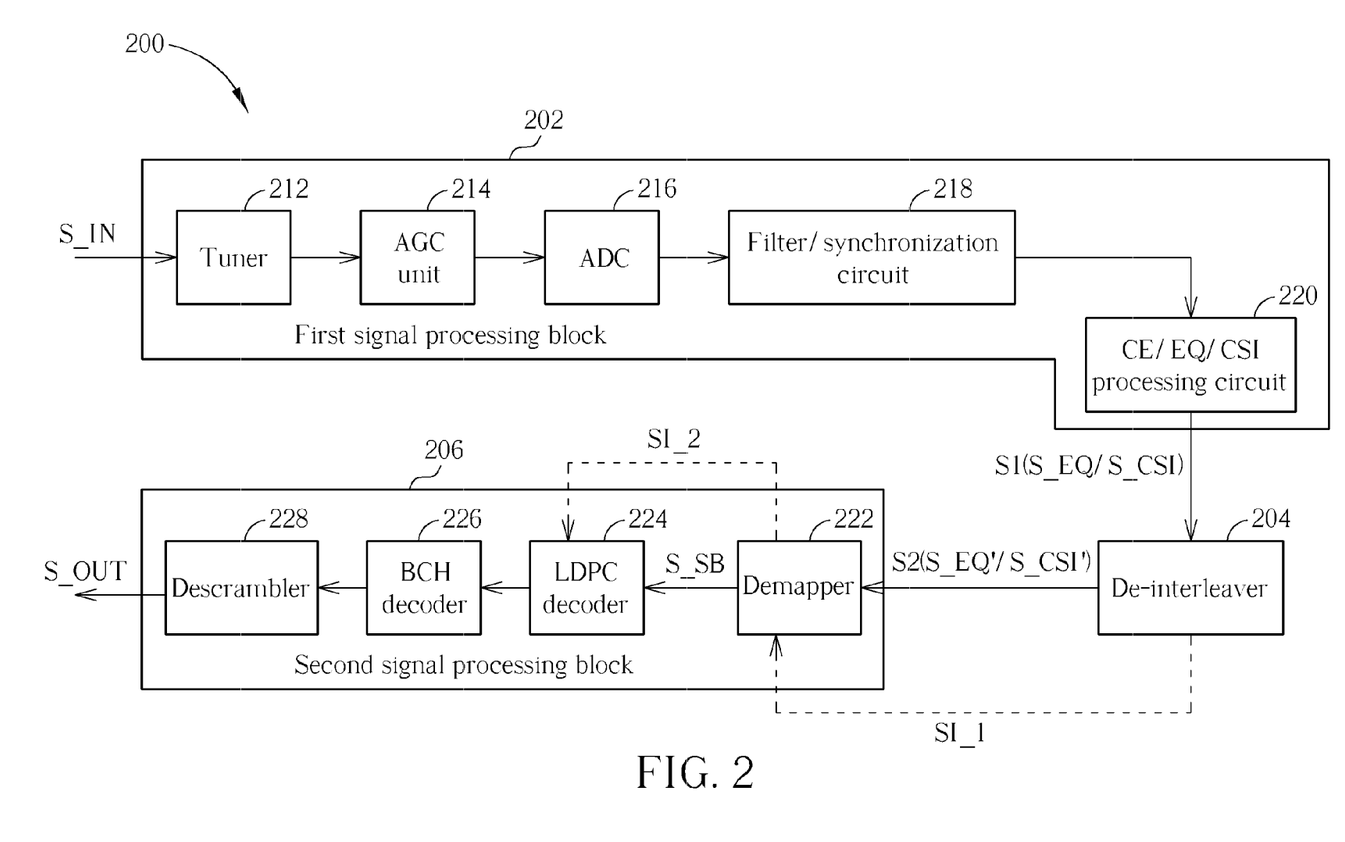
FIG. 2 is a block diagram illustrating a first exemplary embodiment of a wireless communication receiver according to the present invention.

FIG. 2 is a block diagram illustrating a first exemplary embodiment of a wireless communication receiver according to the present invention. The wireless communication receiver 200 includes a first signal processing block 202, a de-interleaver 204, and a second signal processing block 206. In this embodiment, the first signal processing block 202 is implemented for receiving a wireless communication signal S_IN and processing the wireless communication signal S_IN to generate a first output S1; the de-interleaver 204 is coupled between the first signal processing block 202 and the second signal processing block 206, and comprises a plurality of branches for de-interleaving the first output S1 to generate a second output S2; and the second signal processing block 206 is implemented for processing the second output S2 to generate a receiver output S_OUT corresponding to the wireless communication signal S_IN. For example, the de-interleaver 204 has the same internal hardware configuration as the convolutional de-interleaver 20 shown in FIG. 1; however, the de-interleaver 204 of the present invention is particularly designed to start outputting the second output S2 to the second signal processing block 206 for further signal processing before all buffers included in the branches are full. Besides, the de-interleaver 204 of the present invention also informs the second signal processing block 206 of data that are derived from one or more unfull buffers included in the branches. In this way, the second signal processing block 206 is still capable of dealing with the second output S2 properly, though the second output S2 may include invalid data bits or invalid symbols. In addition, the number of unfull buffers at the time when the de-interleaver starts output the de-interleaved result highly depends on the processing capability of the following second signal processing block 206. For instance, when the second signal processing block 206 is capable of properly dealing with the second output S2 with more invalid data bits/symbols informed by the de-interleaver 204, the de-interleaver 204 is allowed to generate the second output S2 to the second signal processing block 206 earlier before the de-interleaver 204 is full. To better describe technical features of the present invention, a DTMB receiver which serves as one exemplary embodiment of the wireless communication receiver 200 is illustrated as follows. However, this is for illustrative purposes only. The conception of the early de-interleaver output scheme proposed in the present invention can be applied to other wireless communication receiver which suffers from the de-interleaving delay due to the de-interleaver outputting the de-interleaved result after all buffers thereof are full. These alternative designs without departing from the spirit of the present invention all fall within the scope of the present invention.

When the wireless communication receiver 200 is a DTMB receiver, the first signal processing block 202 therefore includes, but is not limited to, a tuner 212, an automatic gain control (AGC) unit 214, an analog-to-digital converter (ADC) 216, a filter/synchronization circuit 218, and a channel estimation (CE)/equalization (EQ)/channel state information (CSI) processing circuit 220, and the second signal processing block 206 includes, but is not limited to, a demapper 222, a low-density parity check (LDPC) decoder 224, a Bose-Chaudhuri-Hocquenghem (BCH) decoder 244, and a descrambler 228. For clarity, the operation and function of each component are briefly described hereinafter.

The tuner 212 performs down-conversion and channel selection upon the wireless communication signal S_IN (i.e., a DTMB signal) received by the wireless communication receiver 200. Next, the AGC unit 214 performs an automatic gain control to adaptively adjust the gain applied to an output of the tuner 212 to thereby make the magnitude of an input fed into the following ADC 216 fall within a specific range. The filter/synchronization circuit 218 is implemented to perform signal filtering and synchronization operation. The CE/EQ/CSI processing circuit 220 can be implemented using a channel estimator, an equalizer (e.g., an orthogonal frequency-division-multiplexing (OFDM) equalizer), and a CSI generator. Therefore, the first output S1, which includes an equalizer output S_EQ and a CSI output S_CSI, is generated to the de-interleaver 204. The de-interleaver 204 de-interleaves the equalizer output S_EQ and the CSI output S_CSI to generate the second output S2, which includes de-interleaved equalizer output S_EQ' and de-interleaved CSI output S_CSI'. Next, the demapper 222 generates a demapping result S_SB, which includes soft bits, according to the de-interleaved equalizer output S_EQ' and the de-interleaved CSI output S_CSI'. The LDPC decoder 224 and the BCH decoder 226 performs inner-code decoding (i.e., LDPC decoding) and outer-code decoding (i.e., BCH decoding) upon the demapping result S_SB in order. Finally, the descrambler 228 descrambles a decoding output generated from the BCH decoder 226 to produce the receiver output S_OUT.

The main conception of the present invention is to make the de-interleaver 204 have an early de-interleaver output for the second signal processing block 206. As data bits or symbols derived from unfull buffers included in branches of the de-interleaver 204 are invalid, the de-interleaver 204 has to give information of these invalid data bits or symbols to the second signal processing block 206 for allowing the second signal processing block 206 to deal with the second output S2 properly. Regarding the receiver configuration shown in FIG. 2, certain exemplary implementations directed to notifying the following signal processing stage of the invalid data bits or symbols are illustrated as follows.

In a first exemplary implementation, the de-interleaver 204 generates a corresponding indicator for each invalid symbol that is derived from one unfull buffer included in the branches of the de-interleaver 204, and outputs the corresponding indicator to the demapper 222. The demapper 222 identifies each invalid symbol of the second output S2, which is derived from one unfull buffer of the de-interleaver 204 according to the corresponding indicator, and generates the demapping result S_SB to the LDPC decoder 224 according to the second output S2 including the de-interleaved equalizer output S_EQ' and the de-interleaved CSI output S_CSI'. In addition, for each invalid symbol that is derived from one unfull buffer of the de-interleaver 204, the demapper 22 is configured to make each of the soft bits corresponding to the invalid symbol equal to a predetermined value (e.g., '0'). As each invalid soft bit would be set by '0' via the demapper 222, the invalid soft bits fed into the following LDPC decoder 224 will not deteriorate the operation of the LDPC decoder 224. In this way, the LDPC decoder 224 can best decode the demapping result S_SB before all buffers included in the de-interleaver 204 are full.

It should be noted that the aforementioned indicator for each invalid symbol that is derived from one corresponding unfull buffer in the de-interleaver 204 can be implemented using an additional indicator SI_1 provided by the de-interleaver 204 or a CSI value. For example, when a buffer at a branch of the de-interleaver 204 is not full, a symbol output from that branch will be accompanied with the indicator SI_1 of one logic value (e.g., '1'); on the other hand, when a buffer at a branch of the de-interleaver 204 is already full, a symbol output from that branch will be accompanied with the indicator SI_1 of the other logic value (e.g., '0'). In this way, the following demapper 222 knows which symbols are valid and which symbols are invalid. When the CSI value is employed to serve as the indicator for indicating that a specific symbol included in the second output S2 is invalid, the de-interleaver 204 is configured to update the original CSI value for the invalid symbol by a predetermined value (e.g., '0') which indicates that the corresponding symbol is not truly valid. Specifically, the CSI value is representative of a signal-to-noise ratio (SNR). When the CSI value for a specific symbol is '0', it indicates that the reliability of the specific symbol is pretty poor.

In a second exemplary implementation, the de-interleaver 204 generates a corresponding first indicator for each invalid symbol that is derived from one corresponding unfull buffer included in the branches of the de-interleaver 204, and outputs the corresponding first indicator to the demapper 222. For example, the first indicator can be either the additional indicator SI_1 or the CSI value set by '0'. The demapper 222 identifies each invalid symbol that is derived from one corresponding unfull buffer of the de-interleaver 204 according to the corresponding first indicator, and generates the demapping result S_SB according to the second output S2 including the de-interleaved equalizer output S_EQ' and the de-interleaved CSI output S_CSI'. In addition, for each invalid symbol notified by the corresponding first indicator provided from the preceding de-interleaver 204, the demapper 222 outputs a second indicator SI_2 for invalid soft bits corresponding to the invalid symbol. For example, invalid soft bits for an invalid symbol, which are output from the demapper 222 will be accompanied with the indicator SI_2 of one logic value (e.g., '1'); on the other hand, valid soft bits for a valid symbol, which are output from the demapper 22 will be accompanied with the indicator SI_1 of the other logic value (e.g., '0'). In this way, the following LDPC decoder 224 knows which soft bits are valid and which soft bits are invalid. Therefore, the LDPC decoder 224 first identifies each invalid soft bit derived from one invalid symbol according to the corresponding second indicator SI_2, and then starts decoding the demapping result S_SB. In this exemplary implementation, for each invalid soft bit derived from one invalid symbol, the LDPC decoder 224 makes the invalid soft bit equal to a predetermined value (e.g., '0'). As each of the invalid soft bits is set by '0' via the LDPC decoder 224 before actually processed by the LDPC decoding, the invalid soft bits will not deteriorate the operation performed by the LDPC decoder 224. In this way, the LDPC decoder 224 can best decode the second output S2 before all buffers included in the de-interleaver 204 are full. It should be noted that the aforementioned second indicator SI_2 for invalid soft bits can be implemented using the CSI value instead. Therefore, when the CSI value is employed to serve as the second indicator SI_2 for indicating that corresponding soft bits of the invalid symbol are invalid, the demapper 222 makes the original CSI value corresponding to the invalid soft bits become a predetermined value (e.g., '0') which indicates that the corresponding soft bits are not truly valid.

With regard to a third exemplary implementation, before the de-interleaver 204 starts de-interleaving the first output S1, the de-interleaver 204 is initialized to therefore make each bit of all buffers included in the branches of the de-interleaver 204 become a predetermined value (e.g., '0') which is also indicative of data derived from one unfull buffer included in the branches. Specifically, all of the CSI values in the de-interleaver 204 are initialized to be the predetermined value before the de-interleaving begins, and then the CSI values will be updated after the de-interleaving begins. However, the corresponding CSI value of the invalid symbol derived from the unfull buffer still has the initial predetermined value (i.e., '0'). Therefore, when the aforementioned indicator for each symbol that is derived from one corresponding unfull buffer is implemented using the CSI value with predetermined value, the de-interleaver 204 is not required to make any amendment to the CSI value after the de-interleaving begins.

Furthermore, as the LDPC decoder 224 is a block-based decoder, the de-interleaver 204 further generates a frame sync which is synchronized with a block boundary of data to be decoded by the block-based decoder (i.e., the LDPC decoder 224). In other words, the frame sync is generated by the de-interleaver 204 to indicate the start of a frame so that the LDPC decoder 224 knows where a start bit of a codeword is. For example, one frame may be an integer multiple of the LDPC block, or two successive frames include one or more (e.g., five) LDPC blocks. The frame sync, which is indicative of a frame boundary, therefore can help the LDPC decoder 224 to correctly identify the LDPC block boundary, thereby facilitating the LDPC decoding operation.

Figure 3:
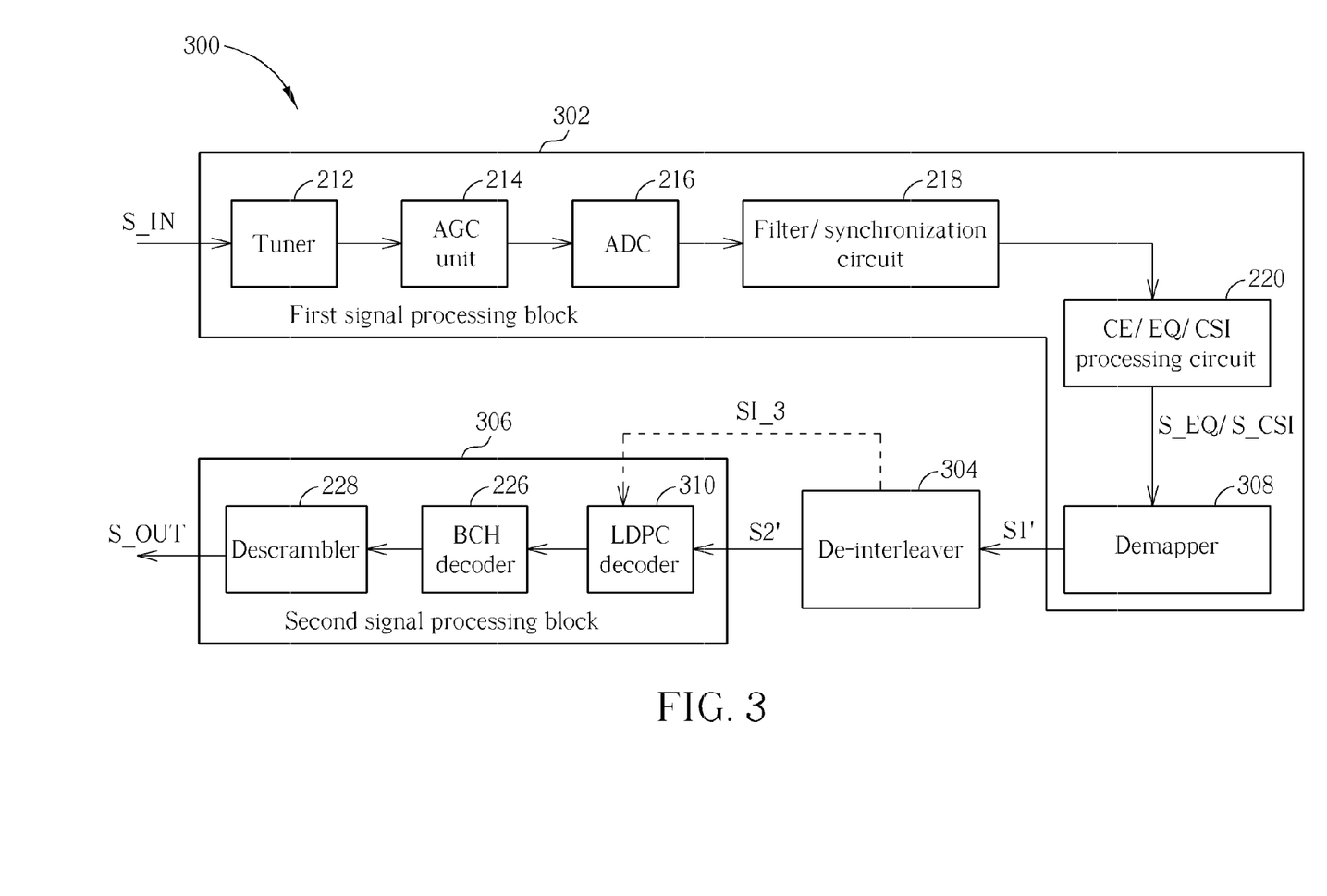
FIG. 3 is a block diagram illustrating a second exemplary embodiment of a wireless communication receiver according to the present invention.

FIG. 3 is a block diagram illustrating a second exemplary embodiment of a wireless communication receiver according to the present invention. The wireless communication receiver 300 includes a first signal processing block 302, a de-interleaver 304, and a second signal processing block 306. In this embodiment, the first signal processing block 302 is configured for receiving a wireless communication signal S_IN and processing the wireless communication signal S_IN to generate a first output S1'; the de-interleaver 304 is coupled between the first signal processing block 302 and the second signal processing block 306, and comprises a plurality of branches for de-interleaving the first output S1' to generate a second output S2'; and the second signal processing block 306 processes the second output S2' to generate a receiver output S_OUT corresponding to the wireless communication signal S_IN. In one implementation, the de-interleaver 304 has the same internal hardware configuration as the convolutional de-interleaver 20 shown in FIG. 1 however, the de-interleaver 304 of the present invention is particularly designed to start outputting the second output S2' to the second signal processing block 306 for further signal processing before all buffers included in the branches thereof are full. Besides, the de-interleaver 304 also informs the second signal processing block 306 of data that are derived from one or more unfull buffers included in the branches. In this way, the second signal processing block 306 is still capable of dealing with the second output S2' correctly, even though the second output S2' includes invalid data.

The difference between the second exemplary embodiment shown in FIG. 3 and the first exemplary embodiment shown in FIG. 2 is that the de-interleaver 304 is positioned between the demapper 308 and the LDPC decoder 310. Therefore, the demapper 308 generates the first output S1' according to the equalizer output S_EQ and CSI output S_CSI generated from the preceding CE/EQ/CSI processing circuit 220. Specifically, the demapper 308 generates the first output S1' (i.e., a demapping result which includes soft bits) by combining a demapping output of the equalizer output (e.g., constellation symbols) S_EQ with the CSI output S_CSI. For instance, the demapper 308 generates soft bits by demapping the equalizer output S_EQ, and then further multiplies these soft bits by the CSI output S_CSI to derive the first output S1'.

As data (soft bits) derived from unfull buffers of the de-interleaver 304 are invalid, the de-interleaver 304 therefore has to give information of the invalid data (soft bits) to the second signal processing block 306, allowing the second signal processing block 306 to process the second output S2' correctly. Regarding the receiver configuration shown in FIG. 3, certain exemplary implementations directed to informing the following signal processing stage of the invalid data are illustrated as follows.

In a first exemplary implementation, the de-interleaver 304 generates a corresponding indicator SI_3 for soft bits that are derived from one corresponding unfull buffer included in the branches of the de-interleaver 304. For example, when a buffer at a branch of the de-interleaver 304 is not full, soft bits output from that branch will be accompanied with the indicator SI_3 of one logic value (e.g., '1'); on the other hand, when a buffer at a branch of the de-interleaver 304 is already full, soft bits output from that branch will be accompanied with the indicator SI_3 of the other logic value (e.g., '0'). In this way, the following LDPC decoder 310 knows which soft bits are valid and which soft bits are invalid. The LDPC decoder 310 first identifies each soft bit that is derived from one corresponding unfull buffer included in the branches of the de-interleaver 304 according to the corresponding indicator SI_3, and then starts decoding the second output S2'. In addition, for each soft bit that is derived from one corresponding unfull buffer included in the branches, the LDPC decoder 310 makes the soft bit equal to a predetermined value (e.g., '0'). As each of the invalid soft bits is set by '0' through the LDPC decoder 310 before actually processed by the LDPC decoding, the invalid soft bits will not deteriorate the operation performed by the LDPC decoder 310. In this way, the LDPC decoder 310 can best decode the second output S2' before all buffers included in the de-interleaver 304 are full.

In a second exemplary implementation, for invalid soft bits that are derived from one unfull buffer included in the branches of the de-interleaver 304, the de-interleaver 304 makes each of the invalid soft bit equal to a predetermined value (e.g., '0'). In other words, each invalid soft bit fed into the LDPC decoder 310 is set by '0'. As the invalid soft bits, which are 0's, will not deteriorate the operation performed by the LDPC decoder 310, the LDPC decoder 310 can best decode the second output S2' before all buffers included in the de-interleaver 304 are full.

With regard to a third exemplary implementation, before the de-interleaver 304 starts de-interleaving the first output S1', the de-interleaver 304 is initialized to make each bit of all buffers included in the branches of the de-interleaver 304 become a predetermined value (e.g., '0') which is also indicative of data derived from one unfull buffer included in the branches. Specifically, all of the soft bits in the de-interleaver 304 are initialized to be zeros before the de-interleaving begins, and then one or more soft bits will be updated after the de-interleaving begins. Regarding each invalid soft bit derived from the unfull buffer, the invalid soft bit still has the initial predetermined value (i.e., '0'). Therefore, no additional indicator generated from the de-interleaver 304 is needed; besides, the de-interleaver 304 is not required to make any amendment to the soft bits after the de-interleaving begins.

In above exemplary embodiments shown in FIG. 2 and FIG. 3, the LDPC decoder 224 or 310 has the capability to know if the decoded result is correct or not. That is, the parity check of the LDPC decoder can help to check if the decoded result is correct or not. If the parity check is correct, the decoded result has a high probability to be correct. In addition, the following BCH decoder 226 can also help to check if the LDPC decoder output is correct or not. Specifically, the BCH decoder 226 can be operated in an error-detecting mode instead of an error-correcting mode so that it can helps to find an error in the LDPC decoder output.

Please note that the components included in the first signal processing block 202/302 and the second signal processing block 206/306 are for implementing a DTMB receiver. However, when the early de-interleaver output scheme of the present invention is employed in other wireless communication receivers, the first signal processing block 202/302 and the second signal processing block 206/306 should be modified accordingly. For example, the decoder immediately following the de-interleaver 204/304 is not limited to an LDPC decoder. More specifically, the signal processing stages following the de-interleaver 204/304 vary according to design requirements of the wireless communication receiver architecture.

Figure 4:
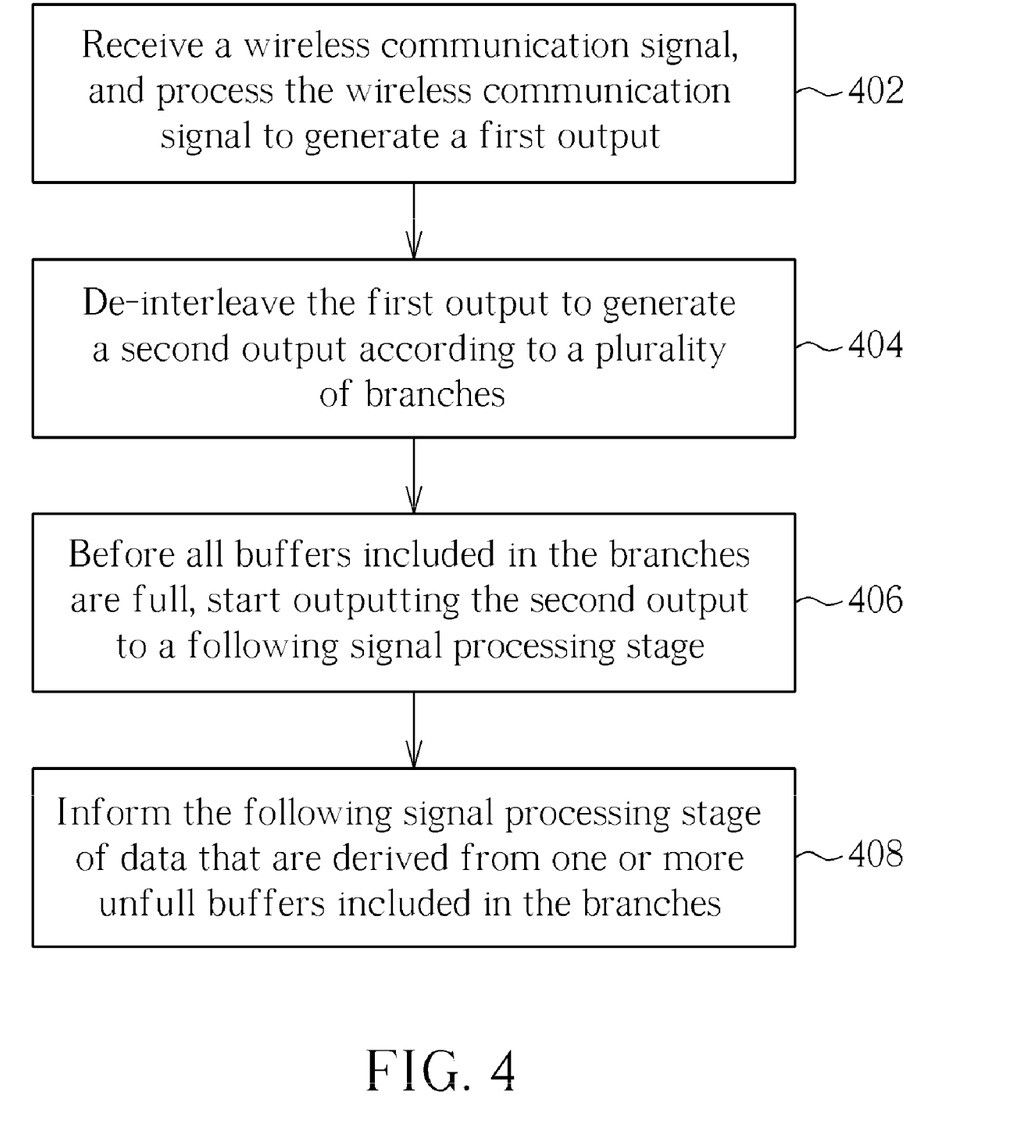
FIG. 4 is a flowchart illustrating a generalized signal processing method employed by a wireless communication receiver according to an exemplary embodiment of the present invention.

In view of above exemplary embodiments, a signal processing method employed by the wireless communication receiver 200/300 can be briefly summarized using following steps shown in FIG. 4.

Step 402: Utilize a first signal processing block 202/302 for receiving a wireless communication signal (e.g., the DTMB signal), and processing the wireless communication signal to generate a first output S1.

Step 404: Utilize a de-interleaver 204/304 for de-interleaving the first output S1 to generate a second output S2 according to a plurality of branches implemented therein.

Step 406: Before all buffers included in the branches are full, utilize the de-interleaver 204/304 to start outputting the second output S2 to a following signal processing stage (e.g., the second signal processing block 206/306).

Step 408: Inform the following signal processing stage of data that are derived from one or more unfull buffers included in the branches of the de-interleaver 204/304.

It should be noted that if the result is substantially the same, the steps are not required to be executed in the exact order shown in FIG. 4. In addition, as a person skilled in the art can readily understand detailed operation of each step mentioned above after reading above paragraphs directed to operations of the wireless communication receivers 200 and 300, further description of each step is omitted here for brevity.

In conclusion, exemplary embodiments of the present invention propose performing decoding, such as LDPC decoding, upon early de-interleaver output when all buffers in the branches of the de-interleaver are not completely full. Therefore, using the early de-interleaver output scheme can reduce the required time to decode the received digital TV signal in a DTMB receiver. As the acquisition time of a selected TV channel can be shortened due to decoding of the early de-interleaver output, the channel scan time and/or the time required to switch from one TV channel to another TV channel can be effectively reduced.

Those skilled in the art will readily observe that numerous modifications and alterations of the device and method may be made while retaining the teachings of the invention.

What is claimed is:

1. A wireless communication receiver, comprising:
    a first signal processing block, for receiving a wireless communication signal and processing the wireless communication signal to generate a first output;
    a second signal processing block;
    a de-interleaver, coupled between the first signal processing block and the second signal processing block, comprising a plurality of branches for de-interleaving the first output to generate a second output, wherein the de-interleaver starts outputting the second output to the second signal processing block for further signal processing before all buffers included in the branches are full, and further informs the second signal processing block of data that are derived from one or more unfull buffers included in the branches.

2. The wireless communication receiver of claim 1, wherein the de-interleaver generates a corresponding indicator for each invalid symbol that is derived from one corresponding unfull buffer included in the branches, and outputs the corresponding indicator to the second signal processing block; and the second signal processing block comprises:
    a decoder; and
    a demapper, coupled between the de-interleaver and the decoder, for identifying each invalid symbol corresponding to one corresponding unfull buffer according to the corresponding indicator, and generating soft bits to the decoder according to the second output, wherein the demapper makes each of invalid soft bits corresponding to the invalid symbol equal to a predetermined value.

3. The wireless communication receiver of claim 2, wherein the decoder is a low-density parity check (LDPC) decoder, and the predetermined value is 0.

4. The wireless communication receiver of claim 2, wherein the decoder is a block-based decoder, and the de-interleaver further generates a frame sync which is synchronized with a block boundary of data to be decoded by the block-based decoder.

5. The wireless communication receiver of claim 2, wherein the corresponding indicator for each invalid symbol that is derived from one corresponding unfull buffer included in the branches is a channel state information (CSI) value adjusted by the de-interleaver.

6. The wireless communication receiver of claim 1, wherein the de-interleaver generates a corresponding first indicator for each invalid symbol that is derived from one corresponding unfull buffer included in the branches, and outputs the corresponding first indicator to the second signal processing block; and the second signal processing block comprises:
    a demapper, coupled to the de-interleaver, for identifying each invalid symbol corresponding to one corresponding unfull buffer according to the corresponding first indicator, and generating soft bits according to the second output, wherein the demapper outputs a corresponding second indicator for invalid soft bits corresponding to the invalid symbol; and
    a decoder, coupled to the demapper, for identifying the invalid soft bits corresponding to the invalid symbol and decoding the soft bits generated from the demapper, wherein the decoder makes each of the invalid soft bits equal to a predetermined value.

7. The wireless communication receiver of claim 6, wherein the corresponding first indicator for each invalid symbol that is derived from one corresponding unfull buffer included in the branches is a channel state information (CSI) value adjusted by the de-interleaver.

8. The wireless communication receiver of claim 6, wherein the corresponding second indicator for the invalid soft bits corresponding to the invalid symbol is a channel state information (CSI) value set by the demapper.

9. The wireless communication receiver of claim 1, wherein the first signal processing block comprises a demapper for generating the first output which includes soft bits; the de-interleaver generates a corresponding indicator for invalid soft bits that are derived from one corresponding unfull buffer included in the branches; and the second signal processing block comprises:
    a decoder, coupled to the de-interleaver, for identifying the invalid soft bits corresponding to the invalid symbol according to the corresponding indicator, and decoding the second output which includes soft bits, wherein the decoder makes the invalid soft bit equal to a predetermined value.

10. The wireless communication receiver of claim 1, wherein the first signal processing block comprises a demapper for generating the first output which includes soft bits; the de-interleaver makes each invalid soft bit derived from one corresponding unfull buffer included in the branches equal to a predetermined value; and the second signal processing block comprises a decoder, coupled to the de-interleaver, for decoding the second output which includes soft bits.

11. The wireless communication receiver of claim 1, wherein before the de-interleaver starts de-interleaving the first output, each bit of all buffers included in the branches is initialized with a predetermined value for informing the second signal processing block of data derived from one unfull buffer included in the branches.

12. The wireless communication receiver of claim 1, wherein the receiver being a Digital Terrestrial Multimedia Broadcasting (DTMB) receiver.

13. A signal processing method, comprising:
    receiving a wireless communication signal, and processing the wireless communication signal to generate a first output;
    de-interleaving the first output to generate a second output according to a plurality of branches;
    before all buffers included in the branches are full, starting outputting the second output to a following signal processing stage; and
    informing the following signal processing stage of data that are derived from one or more unfull buffers included in the branches.

14. The signal processing method of claim 13, wherein informing the following signal processing stage comprises:
    generating a corresponding indicator for each invalid symbol that is derived from one corresponding unfull buffer included in the branches, and outputting the corresponding indicator to the following signal processing stage; and an operation of the following signal processing stage comprises:

performing a demapping operation for identifying each invalid symbol corresponding to one corresponding unfull buffer according to the corresponding indicator, and generating soft bits according to the second output, wherein the demapping operation makes each of invalid soft bits corresponding to the invalid symbol equal to a predetermined value; and performing a decoding operation upon the soft bits.

15. The signal processing method of claim 14, wherein the decoding operation is a low-density parity check (LDPC) decoding operation, and the predetermined value is 0.

16. The signal processing method of claim 14, wherein the decoding operation is a block-based decoding operation, and de-interleaving the first output further comprises:

generating a frame sync which is synchronized with a block boundary of data to be decoded by the block-based decoding operation.

17. The signal processing method of claim 14, wherein generating the corresponding indicator for each invalid symbol comprises: adjusting a channel state information (CSI) value to generate the corresponding indicator for each invalid symbol.

18. The signal processing method of claim 13, wherein informing the following signal processing stage comprises: generating a corresponding first indicator for each invalid symbol that is derived from one corresponding unfull buffer included in the branches, and outputting the corresponding first indicator to the following signal processing stage; and an operation of the following signal processing stage comprises:

performing a demapping operation for identifying each invalid symbol corresponding to one corresponding unfull buffer according to the corresponding first indicator, and generating soft bits according to the second output, wherein the demapping operation outputs a corresponding second indicator for invalid soft bits corresponding to the invalid symbol; and performing a decoding operation for identifying the invalid soft bits corresponding to the invalid symbol and decoding the soft bits generated from the demapping operation, wherein the decoding operation makes each of the invalid soft bits equal to a predetermined value.

19. The signal processing method of claim 18, wherein generating the corresponding first indicator for each invalid symbol comprises: adjusting a channel state information (CSI) value to generate the corresponding first indicator for each invalid symbol.

20. The signal processing method of claim 18, wherein the corresponding second indicator for the invalid soft bits corresponding to the invalid symbol is a channel state information (CSI) value set by the demapping operation.

21. The signal processing method of claim 13, wherein processing the wireless communication signal to generate the first output comprises: performing a demapping operation for generating the first output which includes soft bits; informing the following signal processing stage comprises: generating a corresponding indicator for invalid soft bits that are derived from one corresponding unfull buffer included in the branches; and an operation of the following signal processing stage comprises:

performing a decoding operation for identifying the invalid soft bits corresponding to the invalid symbol according to the corresponding indicator, and decoding the second output which includes soft bits, wherein the decoding operation makes the invalid soft bit equal to a predetermined value.

22. The signal processing method of claim 13, wherein processing the wireless communication signal to generate the first output comprises: performing a demapping operation for generating the first output which includes soft bits; de-interleaving the first output further comprises: making each invalid soft bit derived from one corresponding unfull buffer included in the branches equal to a predetermined value; and an operation of the following signal processing stage comprises: performing a decoding operation for decoding the second output which includes soft bits.

23. The signal processing method of claim 13, further comprising:

before starting de-interleaving the first output, initializing each bit of all buffers included in the branches with a predetermined value for informing the following signal processing stage of data derived from one unfull buffer included in the branches.

* * * * *